(12) United States Patent
Chen et al.

(10) Patent No.: US 12,733,106 B2
(45) Date of Patent: Sep. 8, 2026

(54) SYSTEM FOR ATTACHING A THERMAL INTERFACE MATERIAL TO A HEAT SINK

(71) Applicant: Dell Products L.P., Round Rock, TX (US)

(72) Inventors: Enoch Chen, Taipei City (TW); Ping-Sheng Kao, Hsinchu City (TW); Ryan Lee, Taipei City (TW); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 628 days.

(21) Appl. No.: 18/171,083

(22) Filed: Feb. 17, 2023

(65) Prior Publication Data

US 2024/0284587 A1 Aug. 22, 2024

(51) Int. Cl.

| | |
|---|---|
| ***H05K 3/00*** | (2006.01) |
| ***G06F 1/20*** | (2006.01) |
| ***H05K 1/02*** | (2006.01) |
| ***H05K 1/181*** | (2026.01) |
| ***H05K 7/20*** | (2006.01) |
| *H10W 40/70* | (2026.01) |

(52) U.S. Cl.

CPC ......... *H05K 3/0011* (2013.01); *H05K 1/0204* (2013.01); *H05K 1/181* (2013.01); *H05K 7/20454* (2013.01); *G06F 1/20* (2013.01); *H10W 40/70* (2026.01)

(58) Field of Classification Search

CPC .... H05K 1/0204; H05K 1/181; H05K 3/0011; H05K 7/20454; H01L 23/36; H01L 23/3672; H01L 23/3733; H01L 23/42; G06F 1/20; H10W 40/22

See application file for complete search history.

(56) References Cited

U.S. PATENT DOCUMENTS

| | | | |
|---|---|---|---|
| 9,873,774 B1 * | 1/2018 | Kuczynski | H01L 23/3733 |
| 10,665,398 B1 * | 5/2020 | Namuduri | H01L 23/36 |
| 2003/0152773 A1 * | 8/2003 | Chrysler | H01L 23/36 257/E23.101 |

(Continued)

FOREIGN PATENT DOCUMENTS

JP 2008117833 A * 5/2008

OTHER PUBLICATIONS

Wang et al, "Effect of surface roughness of silicon die and copper heat spreader on thermal performance of HFCBGA," 2009 4th International Microsystems, Packaging, Assembly and Circuits Technology Conference, Taipei, 2009, pp. 581-584. (Year: 2009).*

*Primary Examiner* — A. Dexter Tugbang
(74) *Attorney, Agent, or Firm* — McDermott Will & Schulte LLP

(57) ABSTRACT

A system for attaching a thermal interface material (TIM) to a heat sink positioned on a base layer, the heat sink having a heat sink length and a heat sink width, the system including a plurality of treated sections of the base layer around at least a portion of a perimeter of the heat sink, wherein each treated section of the plurality of treated sections comprises a width, and wherein one or more of the width and the surface roughness of each treated section of the plurality of treated sections is based on the TIM, and wherein the plurality of treated sections form a continuous roughness edge, wherein a portion of the TIM extends onto the roughness edge around the heat sink.

10 Claims, 8 Drawing Sheets

(56) References Cited

U.S. PATENT DOCUMENTS

2013/0058042 A1* 3/2013 Salamon ............. H01L 23/3672
361/720
2015/0200148 A1* 7/2015 Pon ....................... H10W 40/22
438/122
2018/0027691 A1* 1/2018 Czaplewski ........ H01L 23/3733
428/213
2019/0327831 A1* 10/2019 Kato ...................... H05K 1/181
2020/0376614 A1* 12/2020 Zhu ........................... G06F 1/20

* cited by examiner

SYSTEM FOR ATTACHING A THERMAL INTERFACE MATERIAL TO A HEAT SINK

BACKGROUND

Field of the Disclosure

This disclosure relates generally to information handling systems and more particularly to creating a roughness edge around a heat sink to enable removal of a thermal interface material.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Reducing, reusing and recycling are important concerns for improving sustainability. Thermal interface material (TIM), which may include pads, putty and/or tape to conduct heat from chips on the boards to heat sink, are used extensively inside some information handling systems. However, they are almost for single use and then disposed.

SUMMARY

Embodiments disclosed herein may allow a TIM to be cleanly and easily removed from a heat sink, allowing the TIM to be reused and/or recycled.

Embodiments may be directed to a method for attaching a thermal interface material (TIM) to a heat sink positioned on a base layer, the heat sink having a heat sink length and a heat sink width. In some embodiments, the method comprises treating a plurality of sections of the base layer around at least a portion of a perimeter of the heat sink and applying the TIM to the heat sink, wherein a portion of the TIM extends onto the roughness edge around the heat sink, wherein each treated section of the plurality of treated sections comprises a width, and wherein one or more of the width and the surface roughness of each treated section of the plurality of treated sections is based on the TIM, and wherein the plurality of treated sections form a continuous roughness edge.

In some embodiments, the width is between 1 millimeter and 3 millimeters. In some embodiments, the surface roughness is between 0.01 millimeters and 0.1 millimeters. In some embodiments, one or more of the width and the surface roughness of each treated section of the plurality of treated sections is based on a resiliency of the TIM. In some embodiments, one or more of the width and the surface roughness of each treated section of the plurality of treated sections is based on an adhesive property of the TIM. In some embodiments, TIM comprises one of a pad, a thermal putty or a tape. In some embodiments, the method further comprises applying a film of a second material adjacent to a treated section of the plurality of treated sections, wherein the second material has a low adhesion property. In some embodiments, the second material comprises biaxially-oriented polyethylene terephthalate. In some embodiments, the method further comprises forming a hole through the base layer proximate at least one treated section of the plurality of treated sections. In some embodiments, treating the plurality of sections of the base layer around at least a portion of the perimeter of the heat sink comprises treating a plurality of strips in a section of the plurality of sections, wherein a surface roughness of each treated strip is different from a surface roughness of an adjacent treated strip.

Some embodiments may be directed to a system for attaching a thermal interface material (TIM) to a heat sink positioned on a base layer, the heat sink having a heat sink length and a heat sink width. The system may comprise a plurality of treated sections of the base layer around at least a portion of a perimeter of the heat sink, wherein each treated section of the plurality of treated sections comprises a width, and wherein one or more of the width and the surface roughness of each treated section of the plurality of treated sections is based on the TIM, and wherein the plurality of treated sections form a continuous roughness edge, wherein a portion of the TIM extends onto the roughness edge around the heat sink.

In some embodiments, the width is between 1 millimeter and 3 millimeters. In some embodiments, one or more of the width and the surface roughness of each treated section of the plurality of treated sections is based on a structural property of the TIM. In some embodiments, the surface roughness is between 0.01 millimeters and 0.1 millimeters. In some embodiments, one or more of the width and the surface roughness of each treated section of the plurality of treated sections is based on an adhesive layer of the TIM. In some embodiments, the TIM comprises one of a pad, a thermal putty or a tape. In some embodiments, the system further comprises a film of a second material adjacent to a portion of a treated section of the plurality of treated sections, wherein the second material has a low adhesion property. In some embodiments, the second material comprises biaxially-oriented polyethylene terephthalate. In some embodiments, the system further comprises a hole formed through the base layer proximate at least one treated section of the plurality of treated sections.

In some embodiments, at least one treated section of the plurality of treated sections of the base layer around the perimeter of the heat sink comprises a plurality of strips, wherein a surface roughness of each treated strip is different from a surface roughness of an adjacent treated strip.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
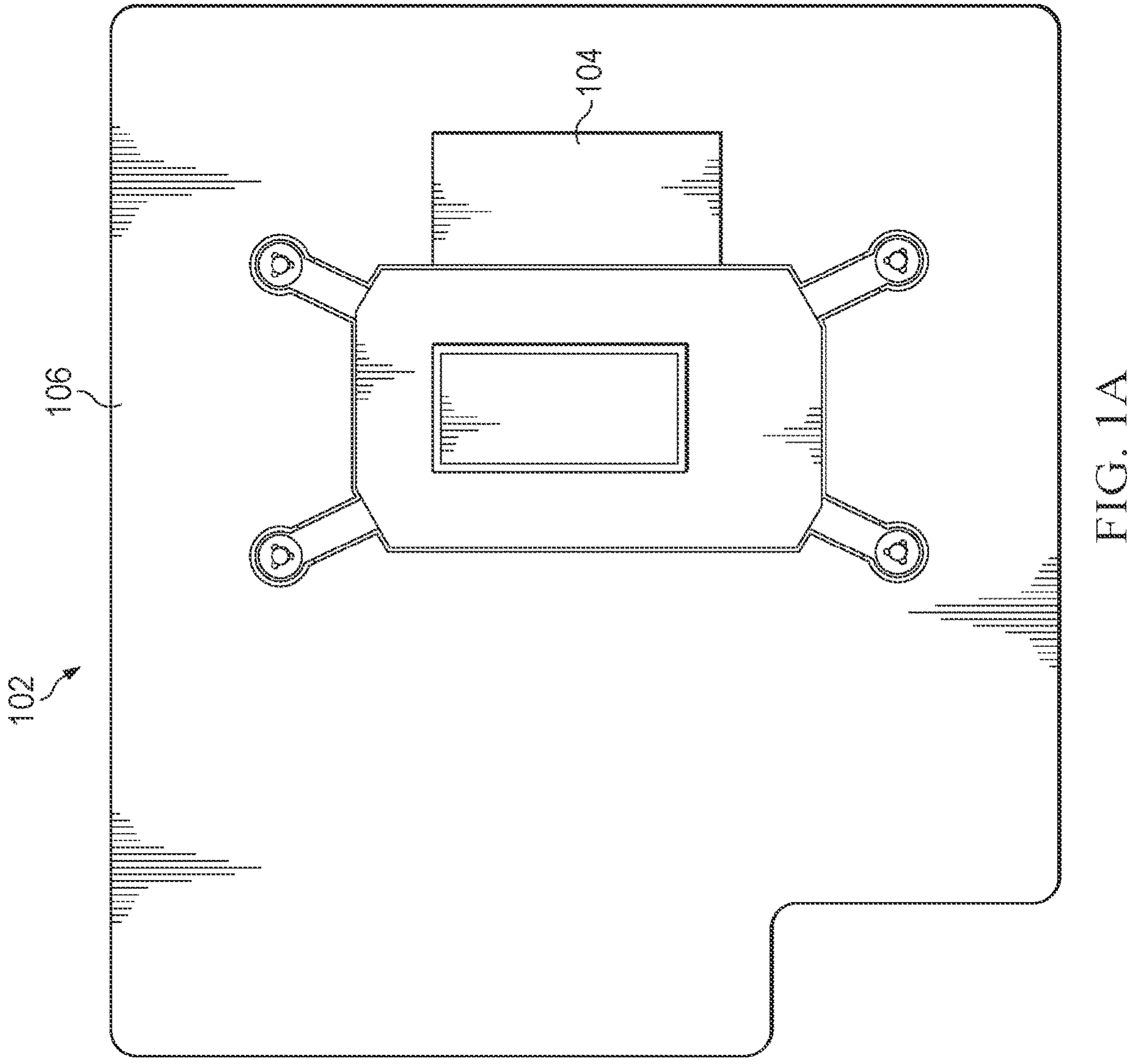
FIG. 1A depicts an example of a heat sink coupled to a base layer.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12-1' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Components described above may generate heat during operation. In some systems, a fan may generate airflow to cool a component. In some systems, a vapor chamber or other heat sink is thermally coupled to the component by a thermal interface material (TIM), which may comprise a putty, a pad or a tape positioned between (and in contact with) the component and the heat sink.

Figure 1B:
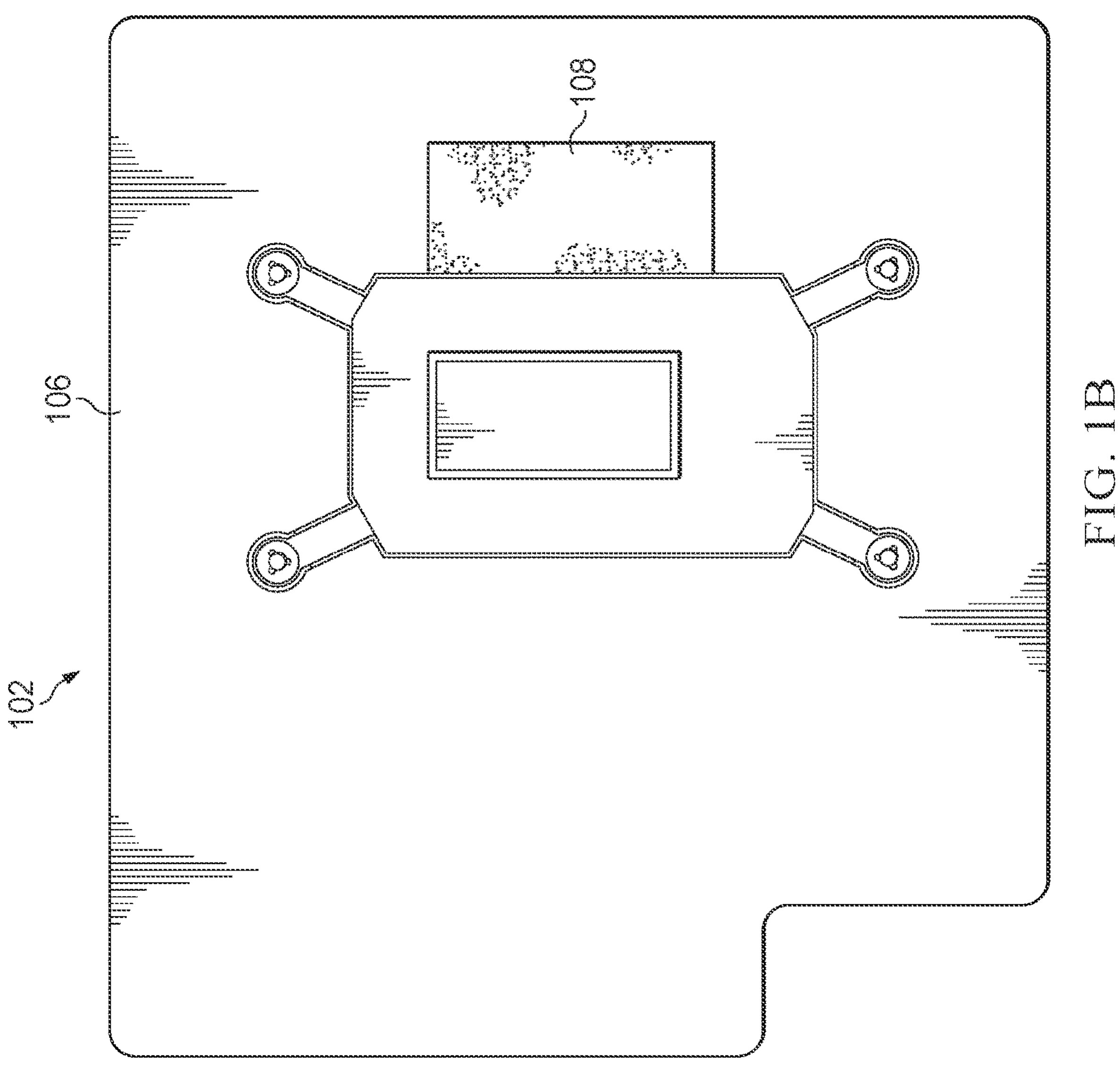
FIG. 1B depicts the example of FIG. 1A with a TIM attached to the heat sink.

Turning to the drawings, FIG. 1A depicts an exemplary board 102 with an example of a heat sink 104 for cooling a component (not shown) and FIG. 1B depicts board 102 with TIM 108 for positioning between and in contact with heat sink 104 (not visible) and the component.

Heat sink 104 may be, for example, a vapor chamber. TIM 108 may be applied using different techniques. For example, TIM 108 may be applied as a putty to form a pad or may be formed as a pad and then applied to heat sink 104. Once TIM 108 is applied to heat sink 104, a heat generating component (e.g., processors, memory, etc.) may be positioned in contact with a second side of TIM 108 for improved heat transfer between the heat generating component and heat sink 104.

Board 102 may have a protective layer 106 surrounding heat sink 104. Protective layer 106 may be selected for electric insulation or other purposes. In some embodiments, protective layer 106 may comprise biaxially-oriented polyethylene terephthalate for example.

Figure 1C:
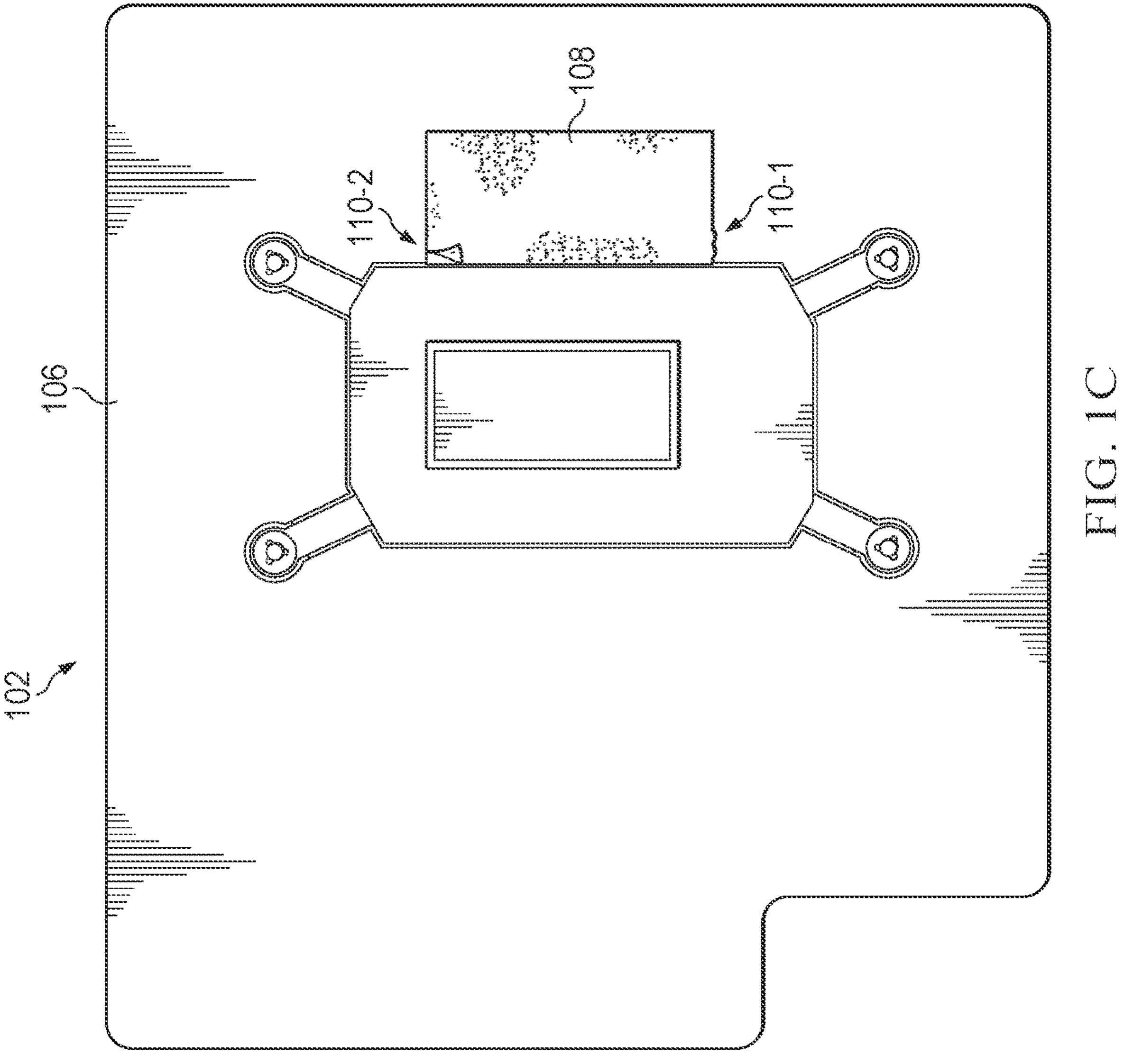
FIG. 1C depicts the example of FIG. 1B with the TIM removed from the heat sink, illustrating issues associated with removing the TIM.

In repairing service, TIM 108 sometimes needs to be removed temporarily. However, the adhesion force between TIM 108 and heat sink 104 may be so high that TIM 108 may be difficult to remove from a surface of heat sink 104. FIG. 1C depicts the example of FIG. 1B with TIM 108 removed from heat sink 104, illustrating deformed area 110-1 and crack 110-2 associated with trying to remove TIM 108.

During one test, only about 10% of TIM 108 was removed from heat sink 104. In these cases, TIM 108 cannot be reused and a fresh TIM 108 is needed for good contact between the heat generating component and heat sink 104. Removal of TIM 108 from heat sink 104 may necessary before new TIM 108 can be applied.

The extent to which TIM 108 may be difficult to remove from a surface of heat sink 104 may depend on, for example, the composition of TIM 108, how much heat that TIM 108 is required to transfer, a surface texture of heat sink 104, or how long TIM 108 has been in contact with heat sink 104. For example, a polished surface finish of heat sink 104 may allow for better contact with TIM 108 but increase the adhesion force. The higher the adhesion force between TIM 108 and heat sink 104, the more likely that trying to remove TIM 108 from heat sink 104 will cause cracks or deformation in TIM 108.

One approach to making it easier to remove TIM 108 from heat sink 104 may involve forming TIM 108 with a hardened surface or PET surface. This approach can mitigate damage to TIM 108 but typically results in additional thermal resistance in the interface.

Embodiments disclosed herein include a method for enabling TIM 108 to be peeled of heat sink 104 easily and cleanly. Embodiments also include a chassis and a board 102 forming a base layer configured with a plurality of sections treated to have a surface roughness greater than a surface roughness associated with other areas of board 102, wherein the term "surface roughness" may refer to an average of surface heights and depths across a surface. Increasing the surface roughness of board 102 may lower an adhesion force between TIM 108 and board 102. Reducing the adhesion force between TIM 108 and board 102 may enable TIM 108 to be peeled of easily and cleanly from board 102 and heat sink 104. Removing TIM 108 cleanly allows TIM 108 to be reused and/or recycled.

Figure 2:
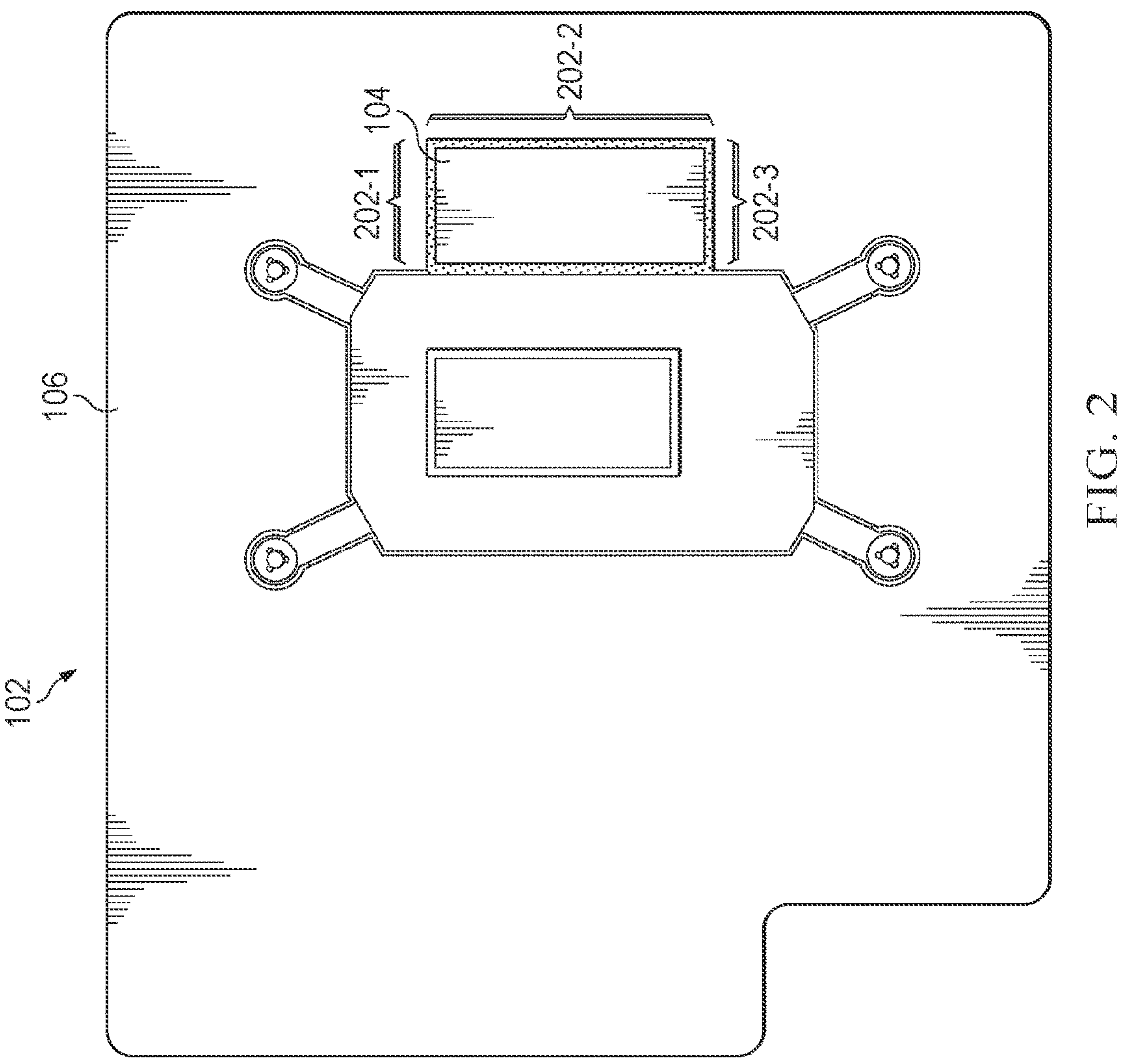
FIG. 2 depicts a top view of a portion of a chassis with a heat sink at least partially surrounded by a plurality of sections treated to have a surface roughness, in accordance with some embodiments.

FIG. 2 depicts a top view of board 102 forming part of a chassis in an information handling system, wherein board 102 comprises heat sink 104 and a plurality of sections 202 around at least a portion of a perimeter of heat sink 104, wherein each section 202 is treated to have a surface roughness greater than a surface roughness associated with other areas of board 102. The plurality of treated sections 202 form a continuous edge at least partially around heat sink 104. The surface roughness results in a reduced adhesion force between TIM 108 and board 102 around heat sink 104, which enables clean and easy removal of TIM 108 from board 102 and heat sink 104.

In some embodiments, a surface roughness may be based on reducing the adhesion force between TIM 108 and board 102. In some embodiments, a surface roughness may be based on ensuring TIM 108 can be pulled by a technician or tool to remove TIM 108 and is able to overcome an adhesion force between TIM 108 and board 102. In some embodiments, a surface roughness may be based on ensuring TIM 108 can be removed from board 102 without damage to TIM 108, board 102 and heat sink 104. In some embodiments, a surface roughness of treated sections 202 may be between 0.5 and 0.1 mm. A surface roughness may be formed by material removal or material deposition. For example, in some embodiments, treated sections 202 may have a surface roughness formed by laser etching material from board 102.

In some information handling systems, forming a roughness edge that completely surrounds heat sink 104 may not be possible or may not be desirable. As depicted in FIG. 2, treated sections 202-1, 202-2 and 202-3 may form a roughness edge around more than half of the perimeter of heat sink 104. In other information handling systems, a plurality of treated sections 202 may form a roughness edge that completely surrounds a perimeter of heat sink 104.

Figure 3:
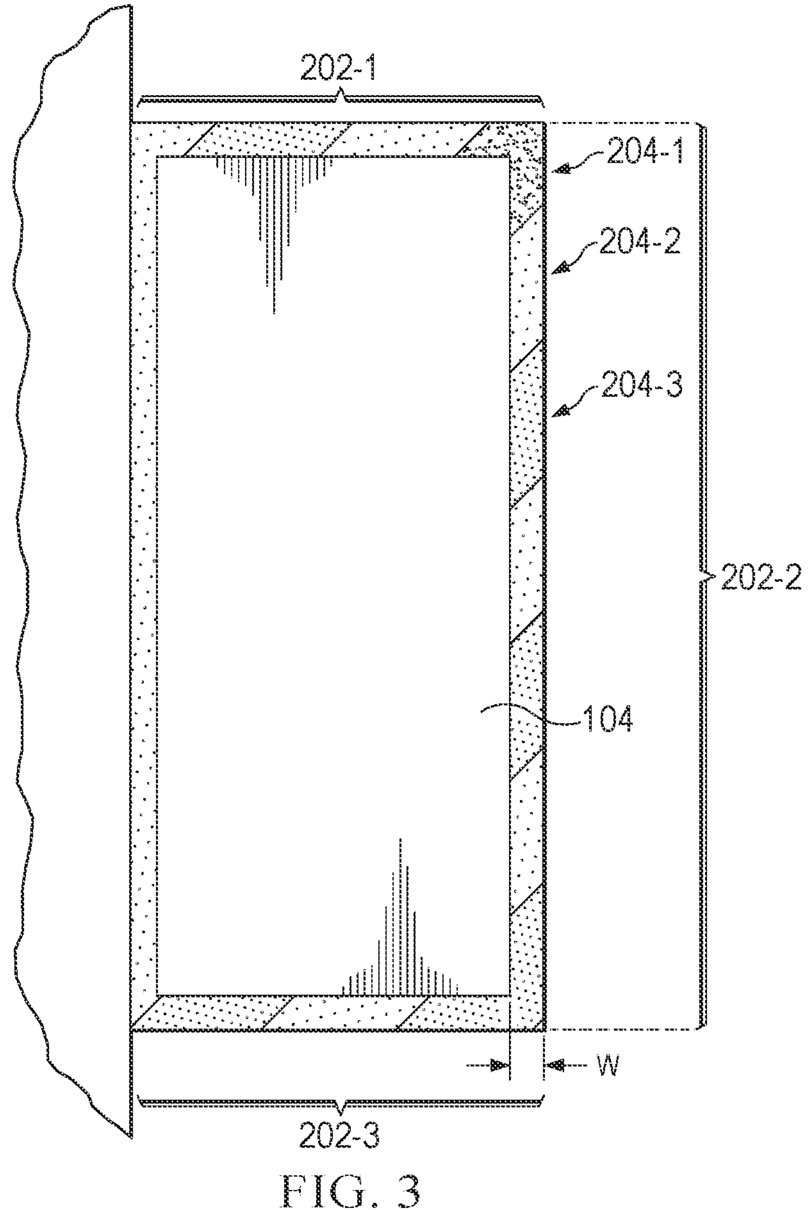
FIG. 3 depicts a close up partial top view of the embodiment depicted in FIG. 2, illustrating a plurality of treated sections, with each treated section comprising a plurality of strips with each strip having a surface roughness.

FIG. 3 depicts a close up partial top view of the embodiment depicted in FIG. 2, illustrating a plurality of treated sections 202 with each treated section 202 having a surface roughness for reducing the adhesion force between TIM 108 and board 102. Each treated section 202 may have a width (W). In some embodiments, an adhesive property and a structural property (e.g., resiliency, strength) of TIM 108 may affect the width. For example, if TIM 108 has strong adhesive properties but low resiliency (e.g., cracks or tears easily), treated sections 202 may be formed with a larger width to allow a user to get more purchase such that a removal force can be applied over a larger amount of TIM 108. In some embodiments, the width (W) of a treated section 202 may be between 0.5 mm and 3 mm. During one test of this embodiment, approximately 85% of TIM 108 was removed from heat sink 104.

In some embodiments, each treated section 202 may comprise a plurality of strips 204, wherein each strip 204 has a surface roughness that may be different from an adjacent strip 204. For example, in some embodiments, strips 204-1 and 204-2 may each have a surface roughness, but the surface roughness may be different. Strips 204 may alternate surface roughness (e.g., strips 204-1 and 204-3 may have the same surface roughness and strip 204-2 may have a different surface roughness) or may have unique surface roughness (e.g., strip 204-1 may have a first surface roughness due to its proximity to a corner, strip 204-2 may have a second surface roughness and strip 204-3 may have a third surface roughness). Strips 204 may be formed perpendicular to heat sink 104 or at a non-perpendicular angle (e.g., any angle between 1 and 89 degrees) relative to heat sink 104. For example, strips 204 depicted in FIG. 3 may be formed approximately 45 degrees relative to heat sink 104. In some embodiments, strips 204 may indicate a preferred direction for removal of TIM 108. For example, strips 204 may indicate a diagonal direction as a preferred direction for removal of TIM 108 from board 102 and/or heat sink 104.

Figure 4:
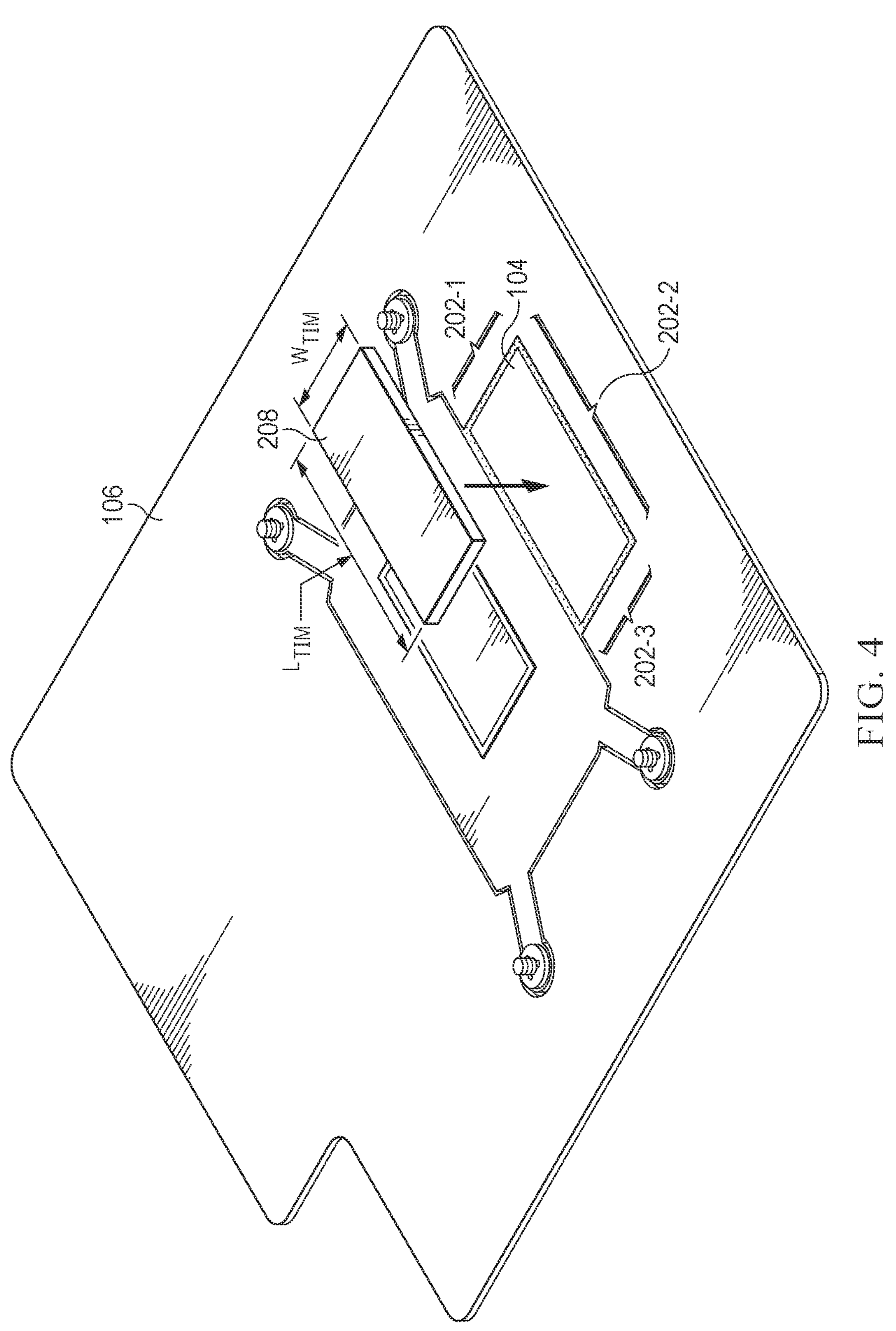
FIG. 4 depicts a perspective view of the embodiment of FIG. 2, illustrating a TIM with dimensions for overlapping the plurality of treated sections.

FIG. 4 depicts a perspective view of the embodiment depicted in FIGS. 2 and 3, illustrating TIM 108 sized for positioning on heat sink 104 and overlapping the plurality of treated sections 202. As shown in FIG. 4, TIM 108 may have a length ($L_{TIM}$) sized for overlapping the length of heat sink 104 and the widths of treated sections 202-1 and 202-3 and may have a width ($W_{TIM}$) sized for overlapping the width of heat sink 104 and the width of treated section 202-2.

Figure 5:
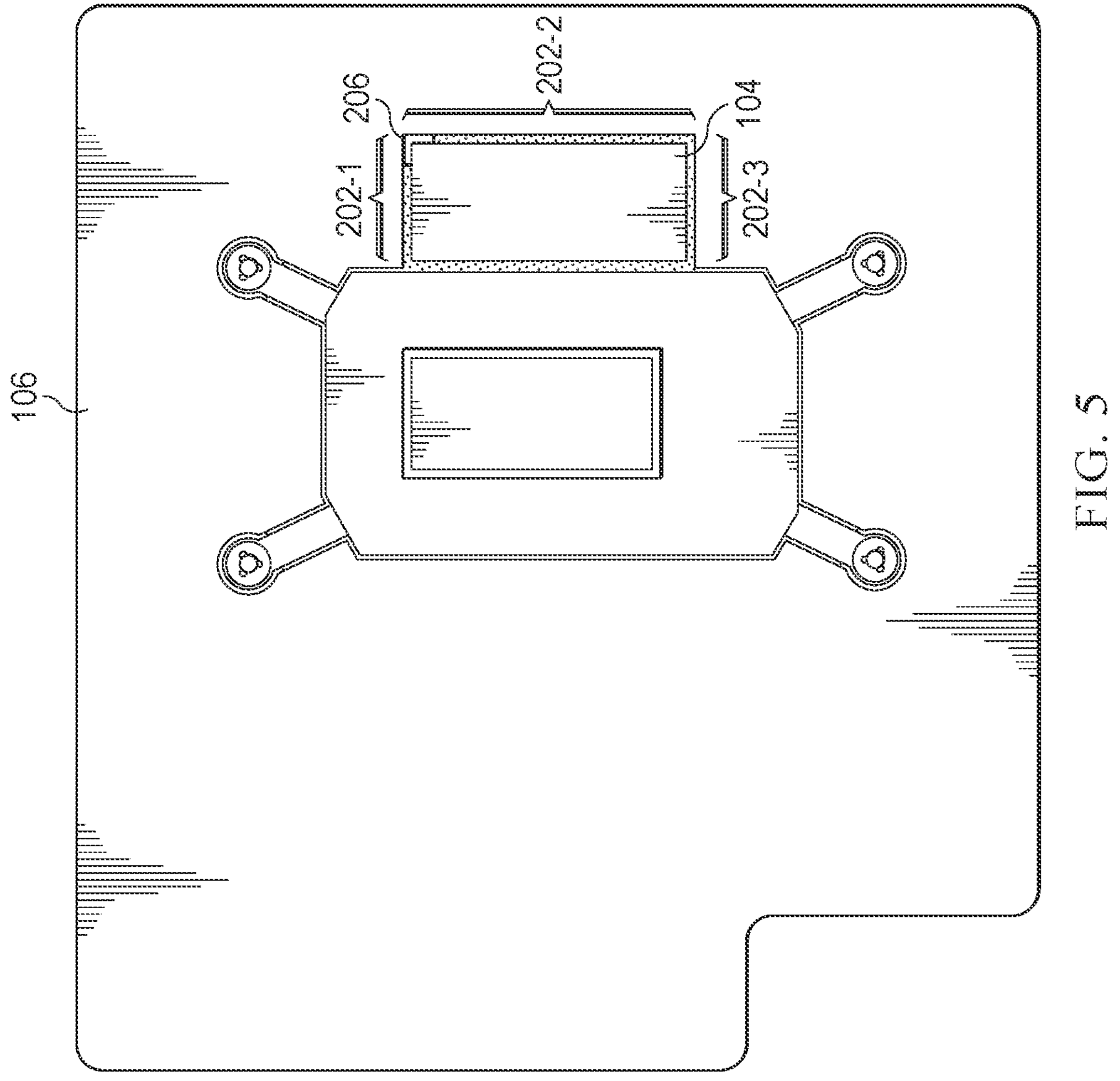
FIG. 5 depicts a top view of a portion of a chassis with a heat sink surrounded by a plurality of treated sections and a through hole, in accordance with some embodiments.

FIG. 5 depicts a top view of board 102 forming part of a chassis in an information handling system, wherein board 102 comprises heat sink 104 surrounded by a plurality of treated sections 202 and through-hole 206. Through-hole 206 may be formed in board 102 along any treated section 202 or (as shown) at a corner formed by two sections 202. TIM 108 may overlap through-hole 206 such that TIM 108 does not contact board 102 relative to through-hole 206, thereby providing a desired amount of purchase for a user to grab TIM 108 (including using a tool to grab TIM 108 or to pry TIM 108 away from board 102. In some embodiments, in addition to providing a starting point for removal of TIM 108 from board 102 and/or heat sink 104, through-hole 206 may indicate a preferred starting point.

Figure 6:
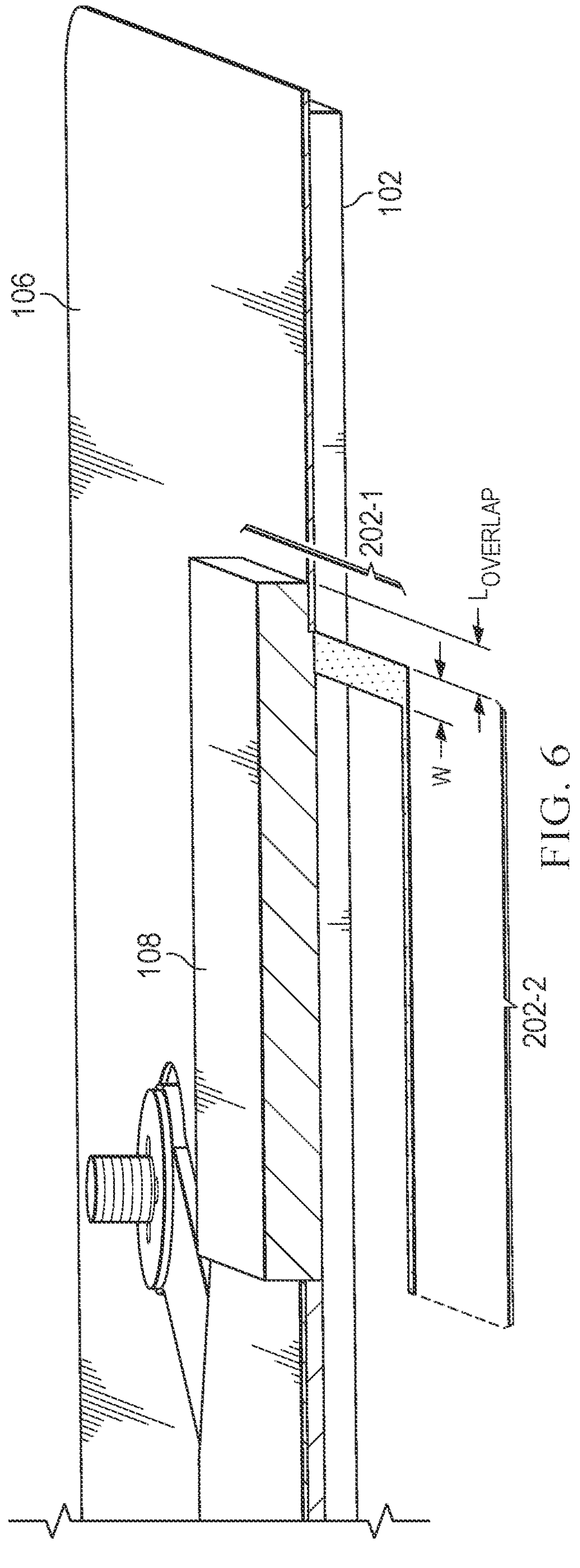
FIG. 6 depicts a partial perspective view of a portion of a chassis with a heat sink surrounded by a plurality of treated sections and the TIM extending to overlap the plurality of treated sections and overlap a portion of a material with reduced surface adhesion.

FIG. 6 depicts a partial perspective view of board 102 forming part of a chassis in an information handling system, wherein board 102 comprises heat sink 104 at least partially surrounded by a plurality of treated sections 202, wherein TIM 108 has a length or width to overlap treated sections 202 and further extends a distance ($L_{OVERLAP}$) to overlap a portion of protective material 106. During one test of this embodiment, substantially 100% of TIM 108 was removed from heat sink 104, allowing TIM 108 to be reused or recycled.

Combinations and variations of embodiments described above are possible. For example, through-hole 206 may be formed in board 102 indicating a preferred starting point for removing TIM 108 and strips 204 may indicate a preferred direction for removing TIM 108.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system for attaching a thermal interface material (TIM) to a heat sink positioned on a base layer, the heat sink having a heat sink length and a heat sink width, the system comprising:

a plurality of treated sections of the base layer around a perimeter of the heat sink, wherein each treated section of the plurality of treated sections comprises a width, and wherein one or more of the width and a surface roughness of each treated section of the plurality of treated sections is based on the TIM, and wherein the plurality of treated sections form a continuous roughness edge, wherein a portion of the TIM extends onto the roughness edge around the heat sink, wherein the heat sink extends along a first direction defining a width of the heat sink and a second direction defining a height of the heat sink, the first direction transverse to the second direction along the perimeter, wherein an entirety of each section of the plurality of treated sections extends at a non-perpendicular angle with respect to the first direction and the second direction along the perimeter.

2. The system of claim 1, wherein the width of each treated section of the plurality of treated sections is between 1 millimeter and 3 millimeters.

3. The system of claim 1, wherein one or more of the width and the surface roughness of each treated section of the plurality of treated sections is based on a structural property of the TIM.

4. The system of claim 3, wherein the surface roughness is between 0.01 millimeters and 0.1 millimeters.

5. The system of claim 1, wherein one or more of the width and the surface roughness of each treated section of the plurality of treated sections is based on an adhesive layer of the TIM.

6. The system of claim 1, wherein the TIM comprises one of a pad, a thermal putty or a tape.

7. The system of claim 1, further comprising a film of a second material adjacent to a portion of a treated section of the plurality of treated sections, wherein the second material has a low adhesion property.

8. The system of claim 7, wherein the second material comprises biaxially-oriented polyethylene terephthalate.

9. The system of claim 1, further comprising a hole formed through the base layer proximate at least one treated section of the plurality of treated sections.

10. The system of claim 1, wherein at least one treated section of the plurality of treated sections of the base layer around the perimeter of the heat sink comprises a plurality of strips, wherein a surface roughness of each treated strip is different from a surface roughness of an adjacent treated strip.

* * * * *